United States Patent [19]
Chiang

[11] Patent Number: 5,822,848
[45] Date of Patent: Oct. 20, 1998

[54] LEAD FRAME HAVING A DETACHABLE AND INTERCHANGEABLE DIE-ATTACH PADDLE

[75] Inventor: Cheng-Lien Chiang, Taipei, Taiwan

[73] Assignee: Industrial Technology Research Institute, Hsinchu, Taiwan

[21] Appl. No.: 658,029

[22] Filed: Jun. 4, 1996

[51] Int. Cl.[6] .................................................. H01R 43/00
[52] U.S. Cl. ................................ 29/827; 29/855; 29/877; 257/675; 257/698; 437/217; 437/902
[58] Field of Search ............................. 29/827, 855, 877; 257/675, 698; 437/209, 211, 214, 217, 218, 220, 902; 438/122

[56] References Cited

U.S. PATENT DOCUMENTS

| | | | |
|---|---|---|---|
| 5,091,341 | 2/1992 | Asada et al. ............................. | 437/902 |
| 5,147,821 | 9/1992 | McShane et al. . | |
| 5,200,809 | 4/1993 | Kwon . | |
| 5,202,288 | 4/1993 | Doering et al. ......................... | 437/902 |
| 5,387,554 | 2/1995 | Liang ....................................... | 29/827 |
| 5,442,234 | 8/1995 | Liang ....................................... | 29/827 |
| 5,570,272 | 10/1996 | Variot ...................................... | 29/855 |

Primary Examiner—W. Donald Bray
Attorney, Agent, or Firm—Tung & Associates

[57] ABSTRACT

A method of detachably mounting a heat sink to a lead frame and then an IC die to the heat sink including the steps of first providing a lead frame that has lead fingers and a multiplicity of tie bars extending inwardly from the lead frame, each tie bar has a fixed end integral with the lead frame and a free end equipped with an attachment means, and then providing a heat sink that has a multiplicity of receptacle means adapted to receive the attachment means on the tie bars as well as at least one opening through the thickness of the heat sink, and detachably engaging the attachment means on the tie bars to the receptacle means on the heat sink. The invention is also directed to a lead frame/heat sink assembly that may have a single IC die or a multiple of IC dies mounted on top of the heat sink. A single IC die or a multiple of IC dies that are mounted to the heat sink can be tested in a KGD or KGS test before being assembled to a lead frame. The heat sink which has at least one opening through its thickness provides both enhanced thermal performance when compared to a conventional heat sink and improved adhesive between the heat sink and a subsequently applied encapsulating compound.

23 Claims, 9 Drawing Sheets

LEAD FRAME HAVING A DETACHABLE AND INTERCHANGEABLE DIE-ATTACH PADDLE

FIELD OF THE INVENTION

The present invention generally relates to a lead frame that is not equipped with a built-in die-attach paddle and more particularly, relates to a lead frame that has a die-attach paddle assembled to it for improved thermal and electrical performance and capability of performing know good die test on an integrated circuit chip that is mounted to the die-attach paddle.

BACKGROUND OF THE INVENTION

In the fabrication process of integrated circuit chips, the packaging of such chips by encasing them in a plastic enclosure to protect from their service environment is an important step. In the past, metal and ceramic packages for IC chips have been used to provide excellent heat dissipation properties. However, metal and ceramic packages are high cost and labor intensive packaging techniques. Plastic encapsulation process for IC chips has therefore been frequently used in recent years in IC packaging. One of those cost effective plastic packaging techniques is the plastic quad flat package (PQFP). The drawback of a plastic molded package is that the desirable heat dissipation property inherent in a metal or ceramic package is lost.

In modern IC devices, the poor heat dissipation in a plastic molded package becomes a more severe problem due to increased device density. The chips are becoming smaller which means that the devices on the chips are being placed closer together. In order to maintain a reasonable service life of an IC device, the operating temperature of a device must be carefully controlled by providing adequate heat dissipation. The more recent use of higher power consumption circuits in IC devices further demands improved heat dissipation. For instance, in a conventional 208-pin PQFP device, only 1 watt power dissipation is required. The power dissipation requirement which is closely related to the heat dissipation property becomes more demanding in a modern CPU or ASIC chip which requires 2–3 watts capability. The heat dissipation property of a plastic molded package must therefore be improved to accommodate the densely packed and the high power consumption IC devices.

Heat sinks have been used to improve heat dissipation in plastic molded packages. A heat sink is normally made of a high heat conductivity material. It is called a heat spreader when the surface of the heat sink is not exposed to the ambient, or a heat slug when the surface of the heat sink is exposed to the ambient. Typical suitable candidate materials for a heat sink are copper, copper alloys, aluminum, aluminum alloys or any other high thermal conductivity materials. When a heat sink is used to improve heat dissipation in an IC device, the heat sink must be mounted in close proximity to a semiconductor chip (or die).

Figure 1:
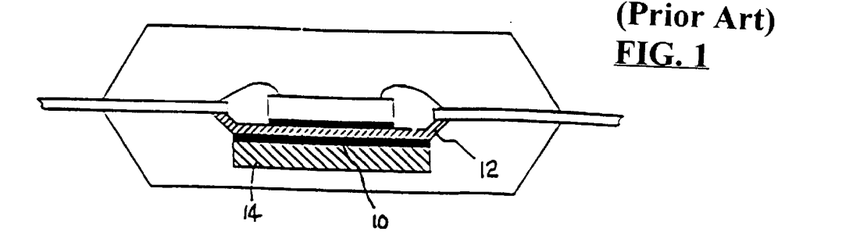
FIG. 1 is an enlarged cross-sectional view of a conventional plastic molded package utilizing adhesive tapes.

Conventionally, in a plastic molded package, the use of a heat sink for improving the thermal dissipation can be carried out by attaching a heat sink to a die-attach paddle formed in a lead frame. The die-attach paddle is a metal platform formed at the center of a lead frame opening and supported by tie bars emanating from the lead frame. One example of the conventional methods is the use of an adhesive tape, e.g., a polyimide tape, between the die-attach paddle and the heat sink. This is shown in FIG. 1. Polyimide tape 10 securely bonds a die-attach paddle 12 to a heat sink 14. In this type of adhesive bonded heat sink, even though an intimate contact between a die-attach paddle and a heat sink is achieved, the tape itself is a heat insulator and therefore impedes the thermal conductance between the die-attach paddle and the heat sink. The application of the adhesive tape further requires an additional processing step which adds to the manufacturing cost. If the size of the heat sink is larger than the die-attach paddle such that it overlaps the lead fingers, it will be a problem for the wire bonding process since the lead fingers can not be clamped by a bonding kit. This means that in the conventional method, the heat sink used can not be larger than the die-attach paddle.

Figure 2A:
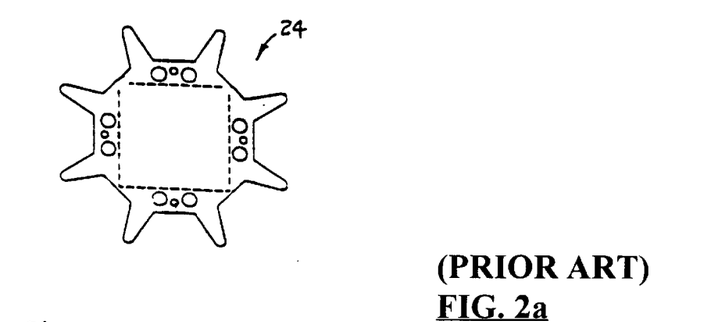
FIGS. 2a–2c are enlarged cross-sectional views of a second conventional method utilizing a heat sink equipped with dimples.
Figures 2B, 2C:
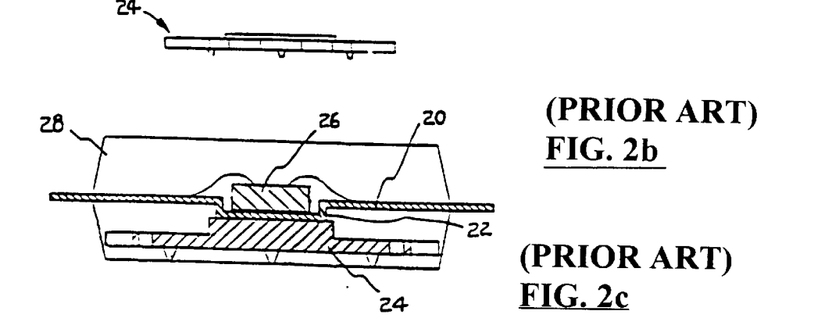

External add-on heat sinks that are positioned next to die-attach paddle have also been used by others to improve the cooling efficiency of an integrated circuit chip encapsulated in plastic. One of such examples is shown in FIGS. 2a–2c. In this external add-on heat sink arrangement, a lead frame 20 which has a die-attach paddle portion 22 is first positioned against an integrated circuit die 26 and a heat sink 24 in a mold fixture. A plastic molded package 28 is then injection molded around the lead frame 20 to encapsulate all the parts. One of the disadvantages of this process is that, during the injection molding process, the die-attach paddle 22 frequently bows away from the heat sink 24 which allows the injected plastic to penetrate in between the die-attach paddle 22 and the heat sink 24. As a result, the trapped plastic material acts as a heat insulator and decreases the heat dissipation efficiency of the heat sink 24.

Figure 3:
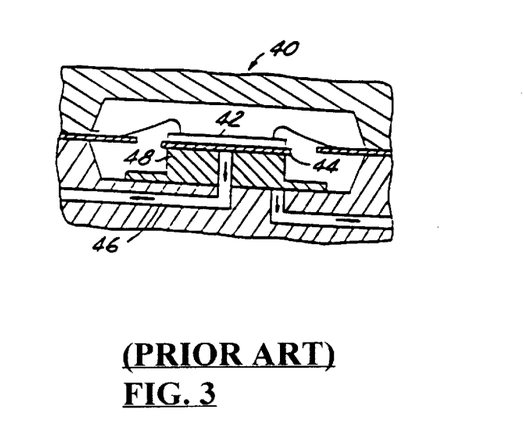
FIG. 3 is in an enlarged cross-sectional view of a third conventional method in which molding apparatus equipped with vacuum channels is used.

In another conventional method for improving heat dissipation between a die-attach paddle and a heat sink, a vacuum passage is provided in the molding apparatus. As shown in FIG. 3. an integrated circuit die 42 is first placed on die-attach paddle 44 prior to the closing of the molding apparatus 40. A vacuum is then drawn through vacuum passage 46 on the underside of the die-attach paddle 44 such that the paddle is tightly pressed against the heat sink 48. A plastic injection process is then carried out to encapsulate the device. The method is generally effective in achieving a good contact between the die-attach paddle and the heat sink, however, vacuum channels must be provided in the molding apparatus which increases the tooling cost and the cycle time.

In a copending application (attorney docket no. 64,600-010) assigned to the common assignee of the present invention, an improved method of assembling a heat sink to a die-attach paddle in a plastic molded package is disclosed. The method is carried out by providing an opening in a die-attach paddle such that an integrated circuit die and a heat sink can be assembled together in a die-bonding process. The heat sink is assembled to the die-attach paddle by frictionally engaging a raised portion of the heat sink and an opening in the die-attach paddle. The heat sink has a recessed area in its top surface defined by a raised ridge adapted to receive an integrated circuit die. The method requires an accurate dimensional control of the opening in the die-attach paddle and the outer peripheral of the heat sink in order for the two parts to frictional engage each other. Furthermore, the size of the heat sink is restricted due to the impossibility of clamping the lead fingers during a wire bonding process.

Most of the conventional methods require the use of a die-attach paddle and thus a permanent assembly of a heat sink to the die-attach paddle. The die-attach paddle must be precisely formed by a photolithography process and an etching process. The die-attach paddle also presents an additional layer of heat insulation which impedes the thermal conductance between the IC chip and the heat sink. Moreover, all the conventional methods require a permanent attachment of a heat sink to a lead frame which limits the heat dissipating efficiency of the heat sink by the restricted area of the heat sink and also makes the testing of an IC chip impossible after it is attached to the heat sink. The capability of testing an IC chip after it is assembled to a heat sink in a KGD (know good die) test is very desirable.

In the conventional IC chip fabrication technology, the chips are die-sawed from a wafer one at a time. These chips are called base chips since they have not been encapsulated (or protected) in plastic packages. The bare chips can be easily damaged by dust, moisture, radiation and temperature variations in the environment. The bare chips can also be damaged during handling due to its fragility and small size. To avoid damages to the circuits on the chips, the bare chips can not be stacked during handling and must be picked-up with extreme care. The performance of a KGD test on the bare chips is therefore almost impossible.

In the conventional fabrication process, a layer of an adhesive tape is first attached to the back of a wafer before the die-sawing process. The bare chips are still attached to the adhesive tape after the die-sawing process. Any potential damages to the chips by falling off the wafer after separation can thus be avoided. After the separation, the bare chips are transferred to the die-attach paddles on lead frames by vacuum means. Any necessary test on the bare chips must therefore be conducted when the chips are still attached to the wafer (so-called wafer level test) before the separation. The questionable chips are marked by ink and separated from those sent to the chip bonding process. The drawback of this testing method is that there is no guarantee that the bare chips are still good after separation by die-sawing. It is therefore advantageous to provide a method of testing a bare chip immediately after its separation from a wafer and its transfer to a die-attach paddle. Of course, this would require that a die-attach paddle to be independent from a lead frame.

In a conventional lead frame, the finger leads for carrying power, ground and signal are situated in the same plane and in close proximity. Interferences frequently occur between them to cause the generation of noise and crosstalk. Attempts have been made to solve these problems by adding two additional metal layers to a lead frame with insulating layers positioned between them and connecting power and ground to the metal layers. This three-layer lead frame structure not only provides improved electrical performance, but also provides spare finger leads for use as the signal leads. The disadvantage of this structure is its high fabrication cost.

It is another object of the present invention to provide a method and apparatus for detachably mounting a die-attach paddle to a lead frame by providing attachment means of tie bars emanating from the lead frame and receptacle means on the die-attach paddle.

It is a further object of the present invention to provide a method and apparatus for mounting a die-attach paddle which has good thermal performance by using a heat sink to a lead frame.

It is still another object of the present invention to provide a method and apparatus for mounting a die-attach paddle which has a double-layer metal plate to enhance the electrical performance of a lead frame.

It is yet another object of the present invention to provide a method and apparatus for mounting a die-attach paddle which has a double-layer metal plate and good thermal conductivity to enhance the electrical and thermal performance of a lead frame.

It is another further object of the present invention to provide a method and apparatus for mounting a die-attach paddle which can be a protective apparatus in order to perform a KGD test to a lead frame.

It is still another further object of the present invention to provide a method and apparatus for mounting an IC die first to a die-attach paddle which has a good thermal performance by using a heat sink and then to a lead frame.

It is yet another further object of the present invention to provide a method and apparatus for detachably mounting a die-attach paddle to a lead frame by engaging an attachment means on the lead frame to the receptacle means on the die-attach paddle.

It is yet another further object of the present invention to provide a method and apparatus for detachably mounting a die-attach paddle to a lead frame by providing V-shaped metal hooks on the lead frame for mechanically latching to receptacle means on the die-attach paddle.

It is yet another further object of the present invention to provide a method and apparatus for mounting a heat sink to a lead frame by adhesively bonding tie bars situated on the lead frame to the die-attach paddle.

SUMMARY OF THE INVENTION

In accordance with the present invention, a method and apparatus for detachably mounting a heat sink to a lead frame such that an IC die may be later attached to the heat sink are provided. In the present invention, method and apparatus, the need for a die-attach paddle for the mounting of a heat sink is eliminated.

In the preferred embodiment, a lead frame that has lead fingers and a multiplicity of tie bars extending inwardly from the lead frame is first provided. Each of the tie bars has a fixed end that is integral with the lead frame and a free end that is equipped with an attachment means. A heat sink that has a multiplicity of receptacle means adapted to receive the attachment means situated at the free end of the tie bars is then provided. The attachment means of the tie bars and the receptacle means of the heat sink are then detachably engaged.

In an alternate embodiment, the lead frame has a multiplicity of tie bars that are adapted to be bonded to corner recessed areas of the heat sink by an adhesive. When a releasable adhesive is used, the heat sink may be detached from the lead frame.

The present invention is further directed to a lead frame/heat sink assembly that has a lead frame with lead fingers and a multiplicity of tie bars extending inwardly from the lead frame. Each tie bar has a fixed end integral with the lead frame and a free end equipped with an attachment means. The assembly further comprises a heat sink that has a multiplicity of receptacle means adapted to receive the attachment means on the tie bars. The attachment means on the tie bars and the receptacle means on the heat sink are detachably engaged together when the heat sink is assembled to the lead frame. An IC die can be mounted to the heat sink either prior to or after the heat sink is engaged with the lead frame.

BRIEF DESCRIPTION OF THE DRAWINGS

Other objects, features and advantages of the present invention will become apparent upon consideration of the specification and the appended drawings, in which:

FIG. 9e is a perspective view showing the tie bars on the lead frame and the receptacle means on the heat slug in an engaged position.

DETAILED DESCRIPTION OF THE PREFERRED AND THE ALTERNATE EMBODIMENTS

In accordance with the present invention, a method for fabricating a lead frame that is not equipped with a built-in die-attach paddle is provided. When a semiconductor device needs a particular performance enhanced, i.e. the thermal or electrical performance, the capability of bare chip testing, and the need for a multichip modules assembly, the die-attach paddle can be modified to suit the specific purpose. For instance, the die-attach paddle can be modified into a heat sink for enhancing the thermal performance, into a double-layer metal plate (where one is the power plane and the other is the ground plane) for enhancing the electrical performance, or into a combination of a testing socket for testing bare chip. To further enhance the electrical performance of the heat sink/lead frame assembly, a three-layer lead frame structure comprising a top signal layer, a middle power layer, and a bottom ground layer may also be used.

The present invention method for providing a lead frame that is not equipped with a built-in die-attach paddle can be used to mount either a single IC die or a multiple of IC dies. When a multiple number of IC dies are mounted, a substrate is first bonded to a heat sink (which is also the die-attach paddle) and then the IC dies are bonded to the substrate. The present invention is described in a preferred embodiment and several alternate embodiments.

In the preferred embodiment, a lead frame that has lead fingers and a multiplicity of tie bars extending inwardly from the lead frame is first provided. Each of the tie bars has a fixed end that is integral with the lead frame and a free end that is normally shorter than the lead fingers and is equipped with an attachment means. A heat sink that has a multiplicity of receptacle means adapted to receive the attachment means at the free end of the tie bars is then provided. The multiplicity of receptacle means on the heat sink is normally equivalent to the multiplicity of attachment means on the tie bars. The attachment means located at the tip of the tie bars can be a compression formed V-shaped metal hook for mechanically latching to a receptacle means on the heat sink. When the heat sink is made of a thin sheet metal piece, the receptacle means formed on the heat sink can be a slot opening to allow the V-shaped metal hook to be mechanically latched to it.

In an alternate embodiment, the receptacle means on a heat sink which is thicker than a thin metal piece, i.e. frequently called a heat spreader, may be formed of a metal trough with an opening at the top to accept the V-shaped metal hook member of the tie bars. In another alternate embodiment, the receptacle means of the heat sink that is substantially thicker i.e., a heat slug which has a surface exposed to the ambient after a plastic encapsulation process, is a metal trough with an open top for latching to the V-shaped hook member on the tie bars. In still another alternate embodiment, the receptacle means on the heat sink is a recessed area in the surface of the heat sink located at each corner. Each of the tie bars in the lead frame is formed with a paddle portion for connecting to the recessed areas in the surface of the heat sink by adhesive means.

Figure 4:
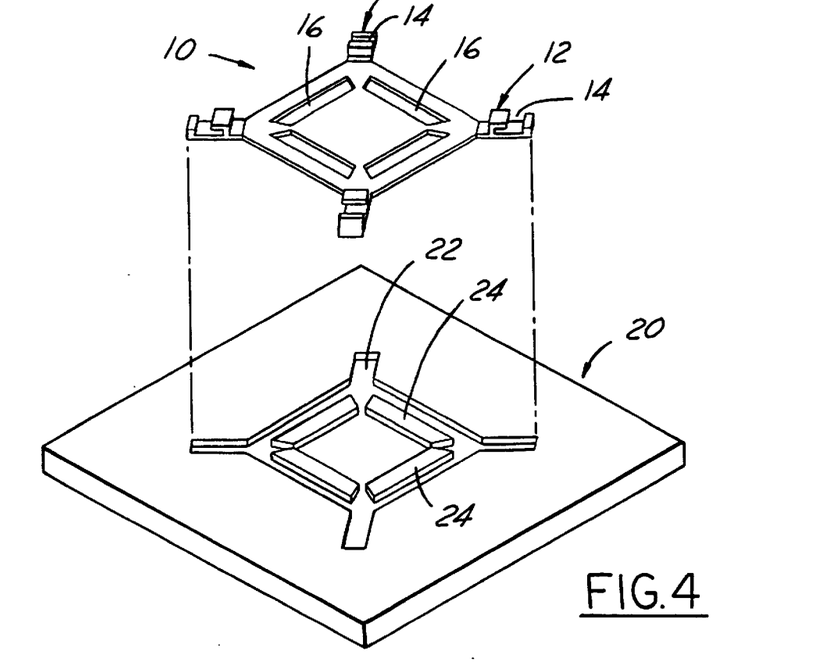
FIG. 4 is a perspective view of the present invention heat sink and the lower cavity of a bonding kit.

Referring initially to FIG. 4, where it is shown a perspective view of a heat sink 10 (a heat spreader) that has a receptacle means 12 formed at each corner. The receptacle means 12 is formed in the shape of a metal trough that has a partially opened top 14. Heat sink 10 has numerous openings 16 through the thickness of the heat sink to help position the heat sink 10 into the lower cavity 20 of a bonding kit. The recessed area 22 provides a seat for the heat sink 10. Locating blocks 24 in the recessed area 22 further assist in positioning the heat sink 10. The locating blocks 24 also serve the function as a support for the lead fingers in a later performed wire bonding operation.

The opening 16 provided in the heat sink 10 is one of the advantages of the present invention. It enables a normal wire bonding process to be conducted by using the locating blocks 24 to support the lead fingers on a large heat sink without a die paddle. Unlike a conventional heat sink without die paddle, the size of the present invention heat sink is not limited by the size of the lead fingers. It has been found that the opening 16 has little effect on the heat dissipation capability of the heat sink 10. Another benefit provided by the opening 16 is that, during the chip encapsulation process, the encapsulating compound flows into the opening and thus provides an improved bonding between the heat sink and the compound. The improved bonding eliminates delamination problems frequently encountered due to differences between the thermal expansion behavior of the heat sink and the encapsulating compound.

Figure 5:
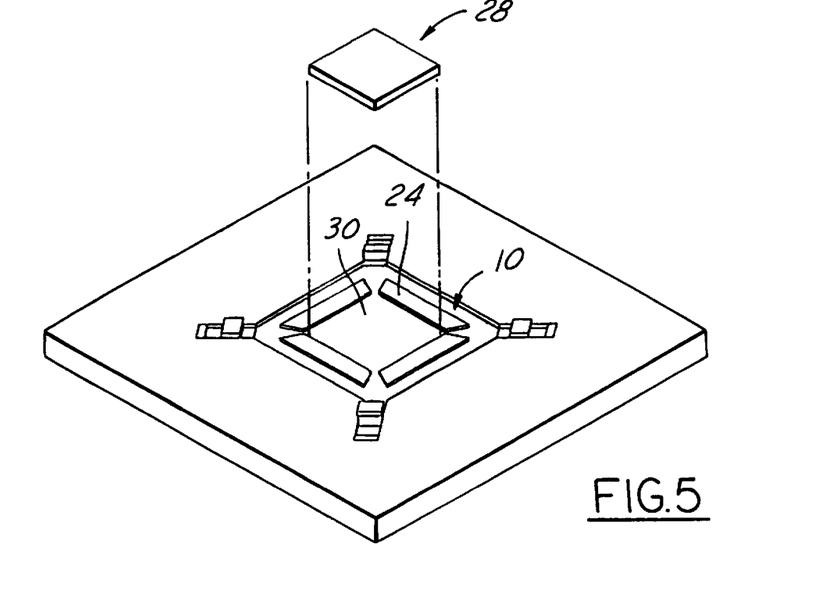
FIG. 5 is a perspective view of an IC die and a heat sink situated in the cavity of a bonding kit.

An IC die 28 is mounted to the heat sink 10 by adhesive means (not shown). A perspective view of the IC die 28 positioned over a cavity 30 is shown in FIG. 5. The locating blocks 24 generally have a thickness slightly larger than the thickness of the heat sink 10 such that the top surfaces of the locating blocks 24 protrude above the top surface of the heat sink 10. The protruding surfaces provide support for the lead fingers in a later performed wire bonding operation. The adhesive used for bonding IC die 28 to the cavity 30 formed in between the locating blocks 24 of the heat sink 10 is accomplished by using a high thermal conductivity adhesive. One of such suitable adhesives is a thermoset polymer loaded with a conductive metal powder such as silver.

Figure 6:
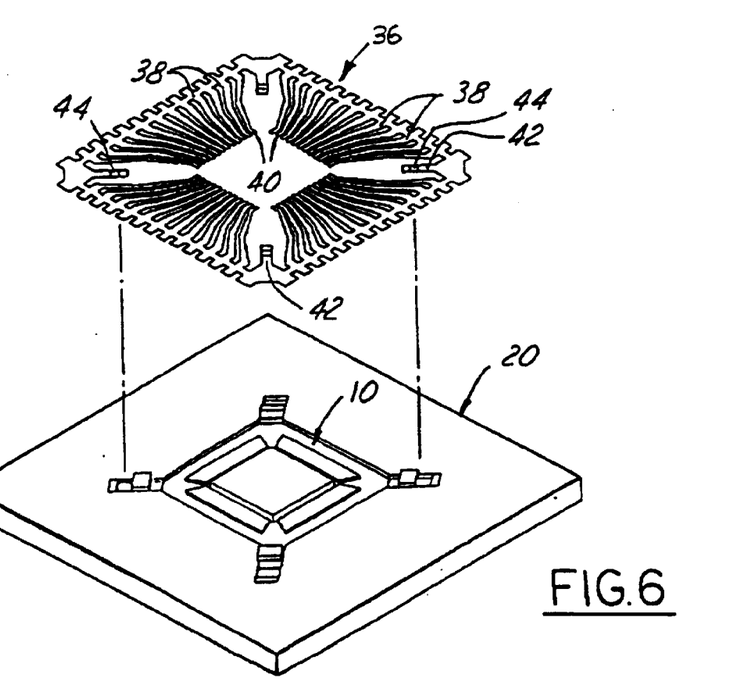
FIG. 6 is a perspective view of a lead frame that has tie bars equipped with attachment means positioned over a heat sink.

Referring now to FIG. 6 where it is shown in a perspective view of a lead frame 36 positioned over a heat sink 10 and a lower cavity of a bonding kit 20. Lead frame 36 has numerous lead fingers 38 and fingertips 40. In lead frame 36, a tie bar 42 is formed at each corner of the lead frame. The tip of the tie bar 42 is compression formed into V-shaped metal hooks 44. An enlarged detailed view of the V-shaped metal hooks is shown in FIGS. 8a–8d.

Before the heat sink 10/die 28 assembly is attached to lead frame 36, die 28 can be tested in a KGD (know good die) test. During the testing process, heat sink 10 protects die 28 from being damaged. The heat sink 1 0/die 28 assembly is attached to lead frame 36 only after the die passes the KGD test.

Figure 7:
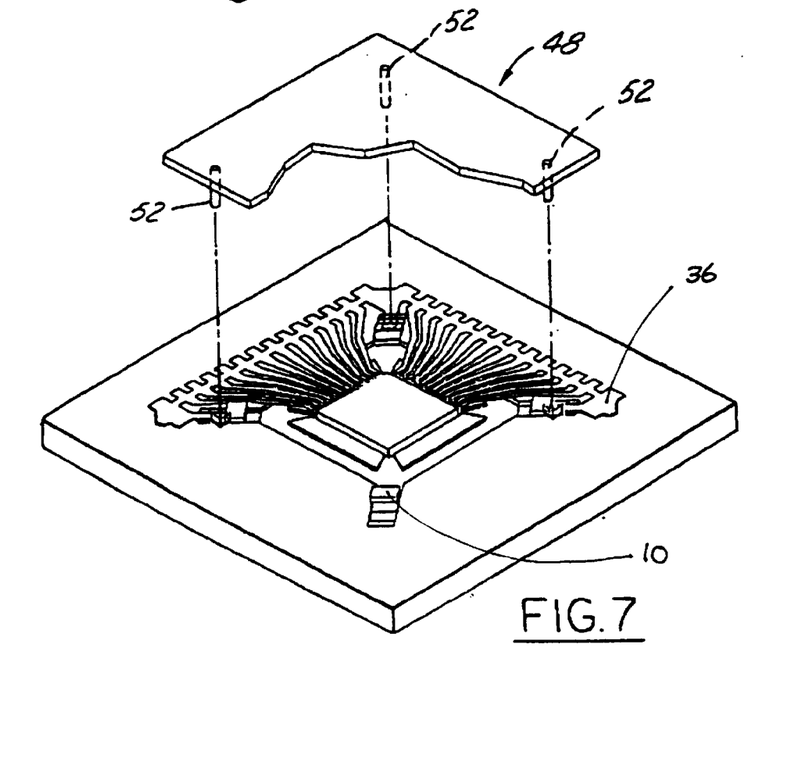
FIG. 7 is a perspective view of an upper cavity of a bounding kit equipped with push pins positioned over a lead frame and a heat sink.
Figure 7A:
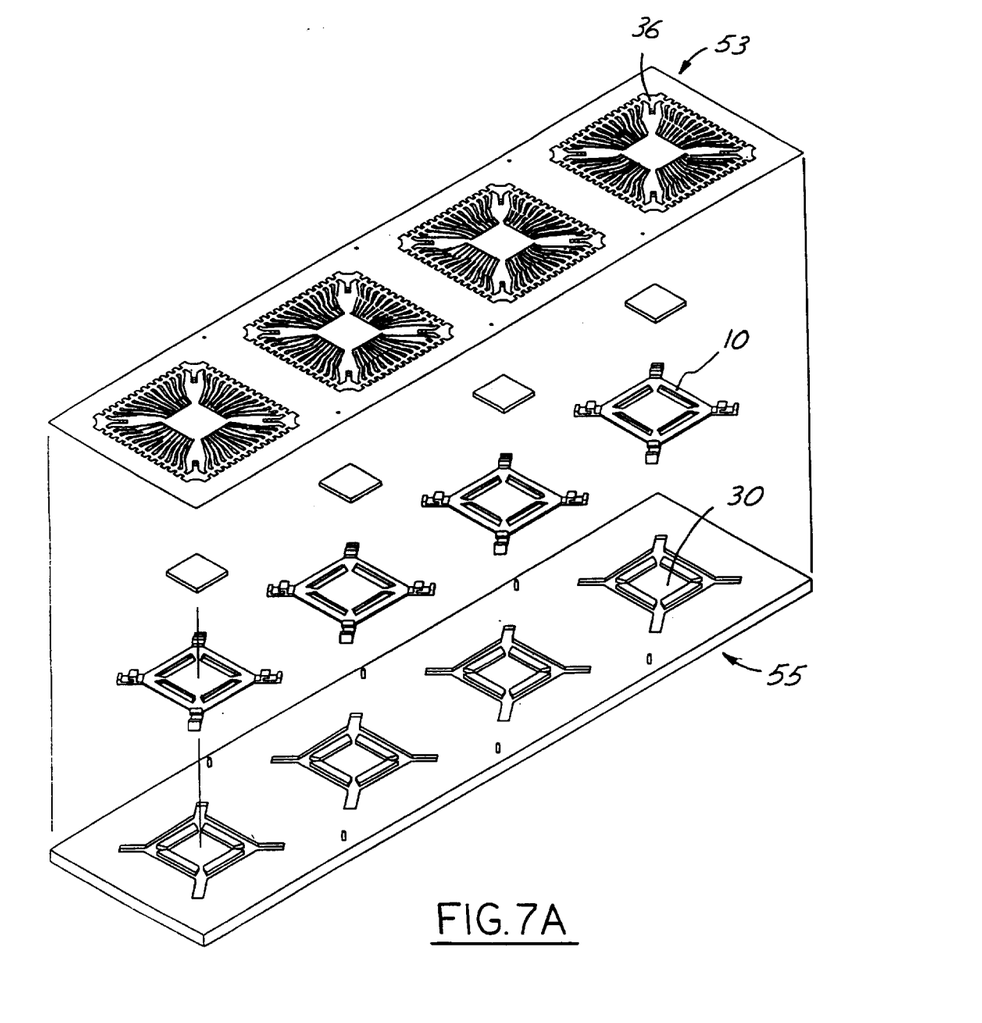
FIG. 7A is a perspective view of a lead frame tape including a multiple number of lead frames being assembled to a multiple number of heat spreaders in a bonding kit that has a multiple number of cavities.
Figure 8A:
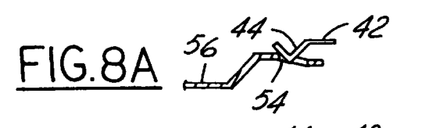
FIGS. 8a–d are enlarged cross-sectional views of the preferred embodiment showing the attachment means on the tie bars engaging the receptacle means on the heat sink.
Figure 8B:
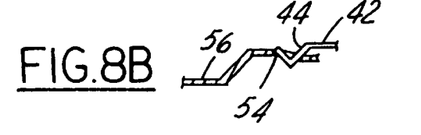
Figure 8C:
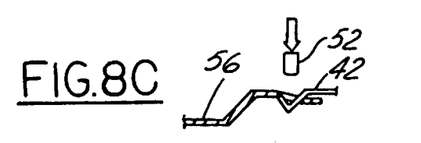
Figure 8D:
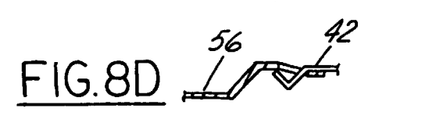
Figure 8E:
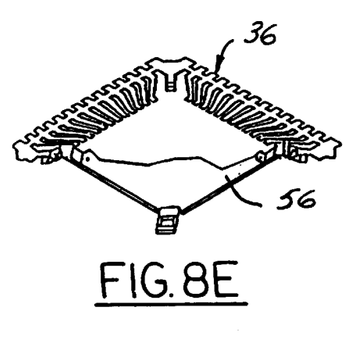
FIG. 8e is a perspective view showing the tie bars on the lead frame and the receptacle means on the heat sink in an engaged position.

FIG. 7 is a perspective view of the upper cavity 48 of a bonding kit equip with a multiplicity of push rods 52. FIG. 7A is a perspective view of a lead frame strip 53 that has a multiple number of lead frames 36 being assembled to a multiple number of heat sink 10 in a bonding kit 55 that has a multiple number of cavities 30. This is a more practical arrangement for use in a fabrication process. Obviously, individual heat sinks can also be assembled to individual lead frames if needed. When the upper cavity 48 (FIG. 7) is positioned over a lead frame 36 and a heat sink 10 and is pushed down in a press (not shown), the push rods 52 force the V-shaped metal hooks 44 latch into opening 54 (FIGS. 8a–8d) such that they are mechanically locked by the opening 54 of the receptacle means 56 on the heat sink. The latching operation is shown in FIGS. 8a–8d. It should be noted that there exists a wide selection of stiffness, or the spring constant, of the metal used in compression forming the V-shaped metal hooks 44 and the receptacle member 56 of the heat sink. The wide latitude in the selection of material properties enables a wide variety of designs of the attachment means on the heat sink and the receptacle means on the lead frame. Parameters such as the metal thickness, the type of metal, and the spring constant of the metal can be selected in each application where mechanical latching of a heat sink to a lead frame is used. FIG. 8e is a partial perspective view of a heat sink 56 engaged to a lead frame 36.

Figures 9A, 9B, 9C, 9D, 9E, 10A, 10B, 10C, 10D, 10E:
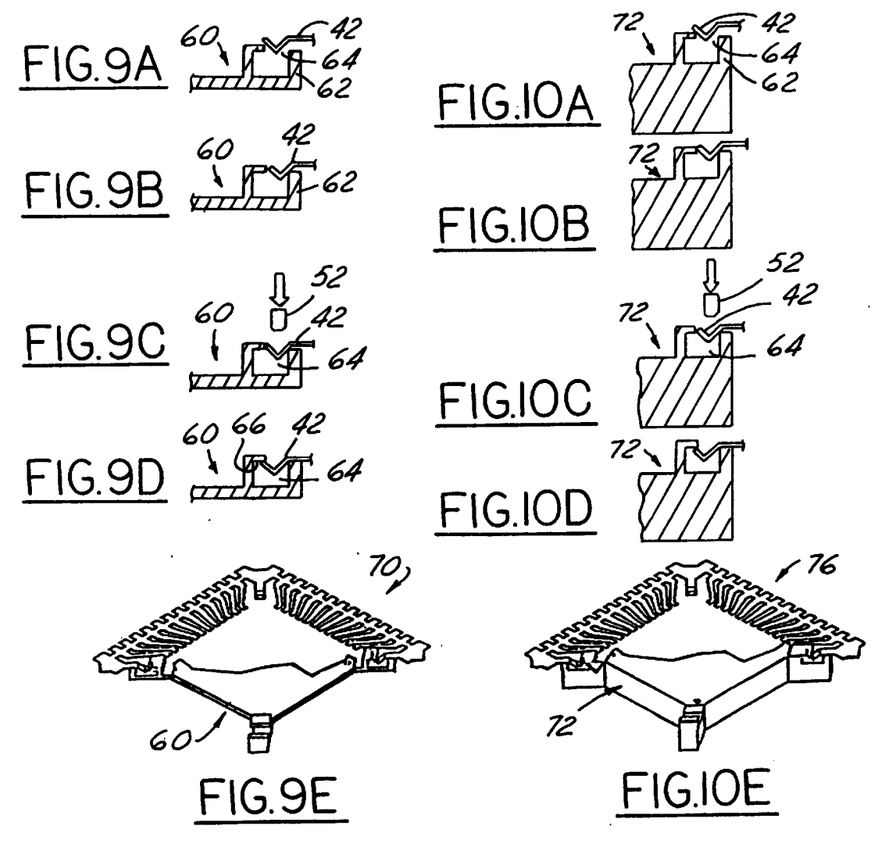
FIGS. 9a–d are enlarged cross-sectional views of an alternate embodiment showing the attachment means on the tie bars engaging the receptacle means on a heat spreader.
FIG. 9e is a perspective view showing the attachment means on the tie bars and the receptacle means on the heat sink in an engaged position.
FIGS. 10a–d are enlarged cross-sectional views of another embodiment showing the attachment means on the tie bars engaging the receptacle means on a heat slug.

FIGS. 9a–9e and FIGS. 10a–10e illustrate two alternate embodiments of the present invention in using V-shaped metal hooks on the tie bars as the attachment means for engaging receptacle means on the heat sink. FIGS. 9a–9d show enlarged cross-sectional view of a V-shaped metal hook 42 engaging an open trough 62 provided at the corners of the heat sink 60. The metal trough 62 has an opening 64 at the top to allow the penetration of the V-shaped metal hook 42. FIGS. 9a and 9b show the sequence of the metal hook 42 being positioned at the opening 64 of the heat sink 60. The heat sink 60 shown in FIGS. 9a–9e is a heat spreader. FIGS. 9c–9d show the sequence of the V-shaped metal hook 42 being pushed into the trough 64 of the heat sink 60. It is seen in FIG. 9d that the tip of the V-shaped metal hook 42 is engaged by the underside 66 of the open trough 60 and thus locking the heat sink 60 in position with the lead frame 70.

Another alternate embodiment of the present invention is shown in FIGS. 10a–10e. The heat sink 72 shown in this embodiment is a heat slug. Similar to that shown in FIGS. 9a–9d, the process shown in FIGS. 10a–10d is for a heat slug 72 which is substantially thicker than the heat spreader 60 of FIGS. 9a–9d. The heat slug 72 is also shown in FIG. 10e in a perspective view of the heat slug 72 and the lead frame 76.

Figure 11:
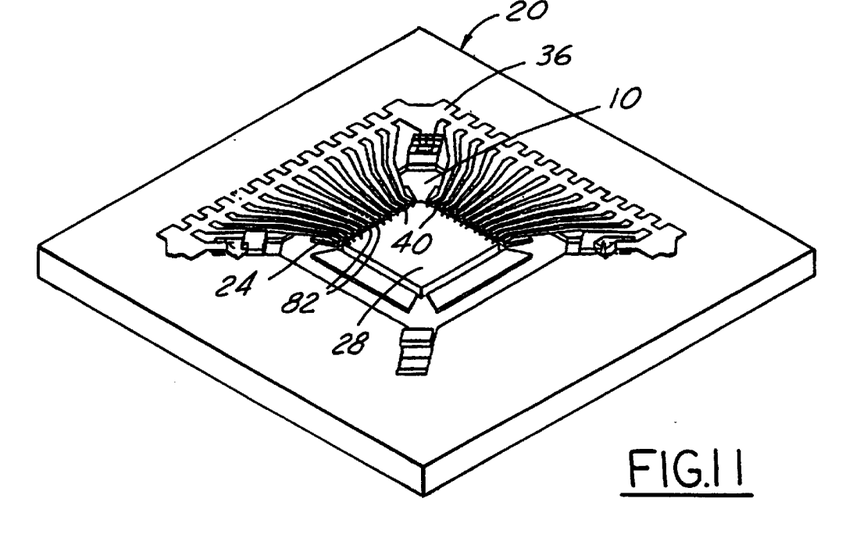
FIG. 11 is a perspective view showing wire bonding between the IC die and the lead fingers on the lead frame.

FIG. 11 is a perspective view showing a lead frame 36 that is assembled to a heat sink 10 in the lower cavity 20 of a bonding kit. Wire bonding is conducted by soldering wires 82 connecting the fingertips 40 and the IC die 28. The protruded surfaces of the locating blocks 24 are used as supports for the wire bonding It should be noted that after the heat sink is latched onto the lead frame as shown in FIGS. 8a–8e, 9a–9e and 10a–10e, the V-shaped mechanical hook can be released from the latched position by using a suitable tool such that the heat sink, together with the IC mounted on top can be detached from the lead frame.

Figure 12:
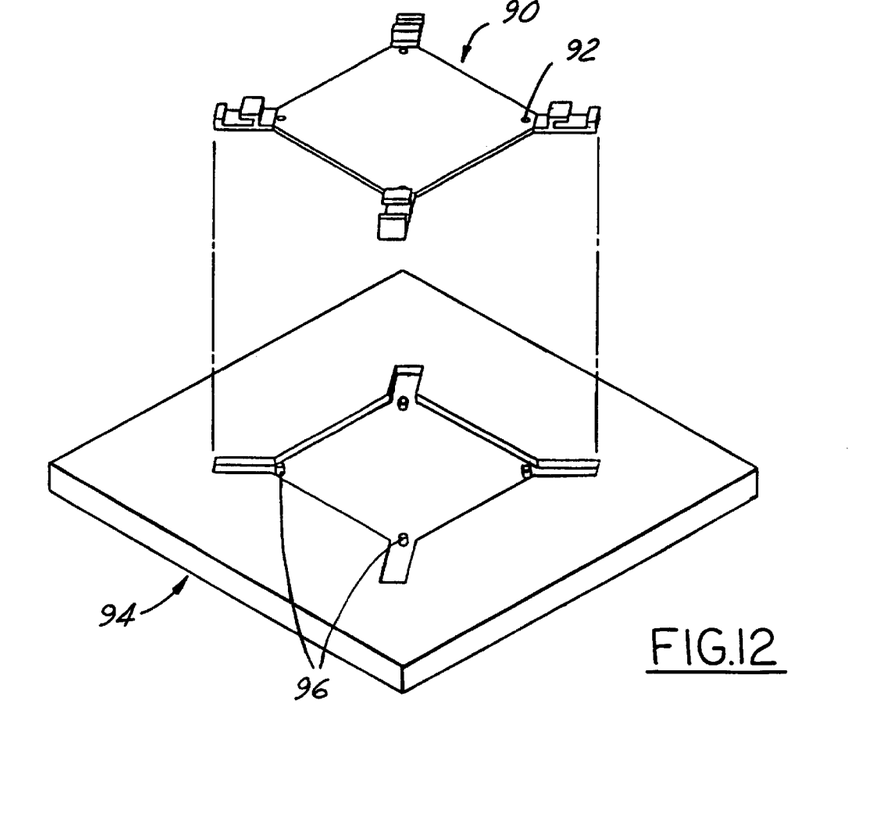
FIG. 12 is a perspective view showing a heat sink positioned over the lower cavity of a bonding kit equipped with locating pins.

FIG. 12 through FIG. 17 illustrate a process for the detachable mounting of a heat sink to a lead frame wherein a multiple number of IC dies are bonded to the heat sink. For instance, as shown in FIG. 12, heat sink 90 having locating holes 92 at each corner is first placed in the lower cavity 94 of a bonding kit equipped with locating pins 96. The locating pins 96 and the locating holes 92 facilitate the precise positioning of the heat sink 90 in the lower cavity 94.

Figure 13:
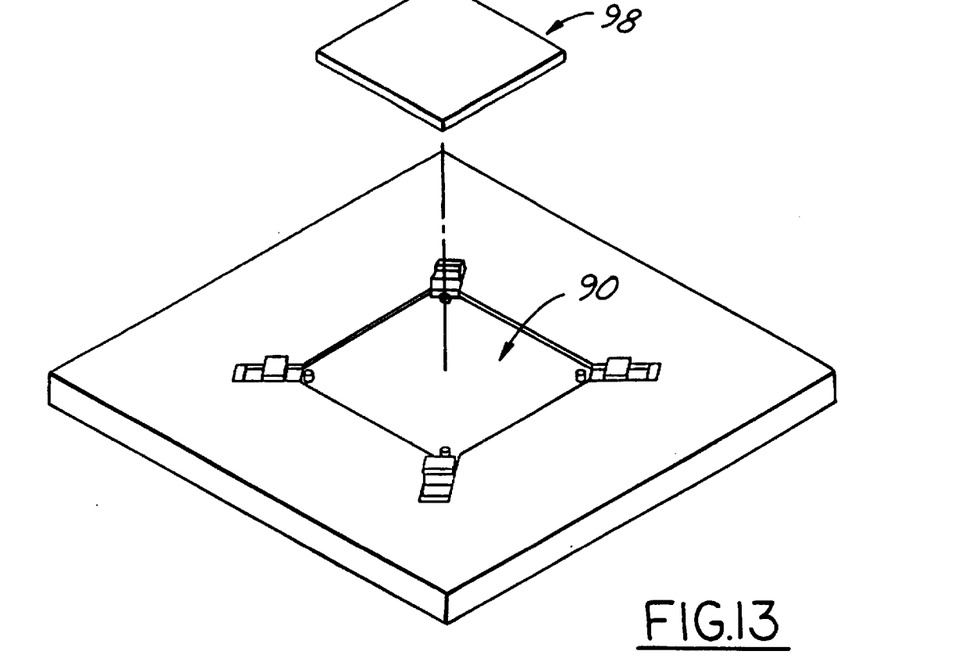
FIG. 13 is a perspective view showing a substrate positioned over a heat sink.
Figure 14:
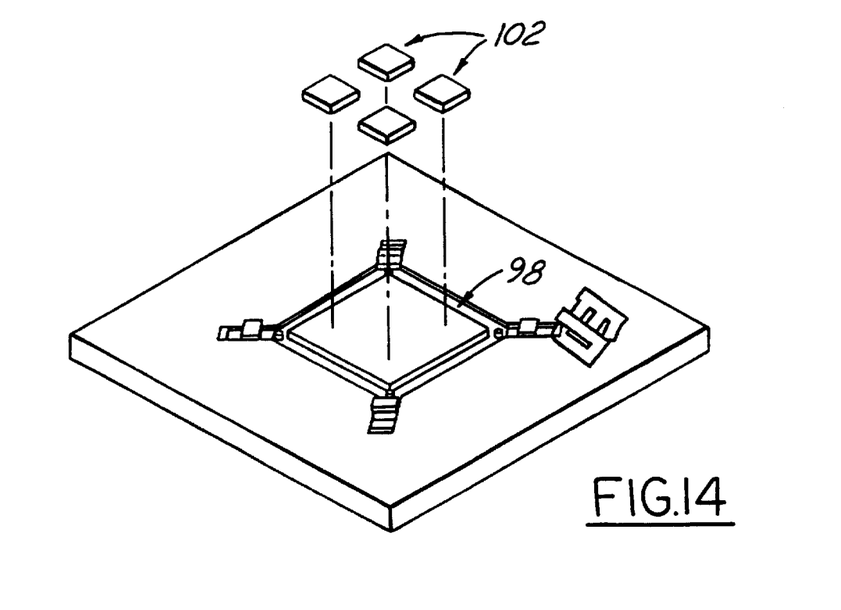
FIG. 14 is a perspective view showing a multiple number of IC dies positioned over a substrate prior to been mounted to the substrate.
Figure 15:
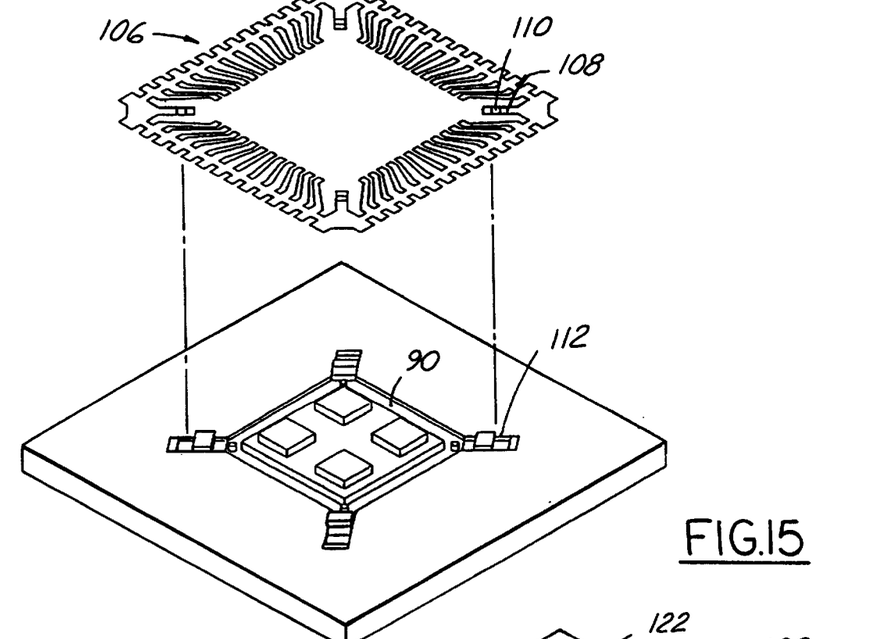
FIG. 15 is a perspective view showing a lead frame equipped with tie bars positioned over a heat sink that is equipped with receptacle means and has a multiple number of IC dies bonded to it.
Figure 16:
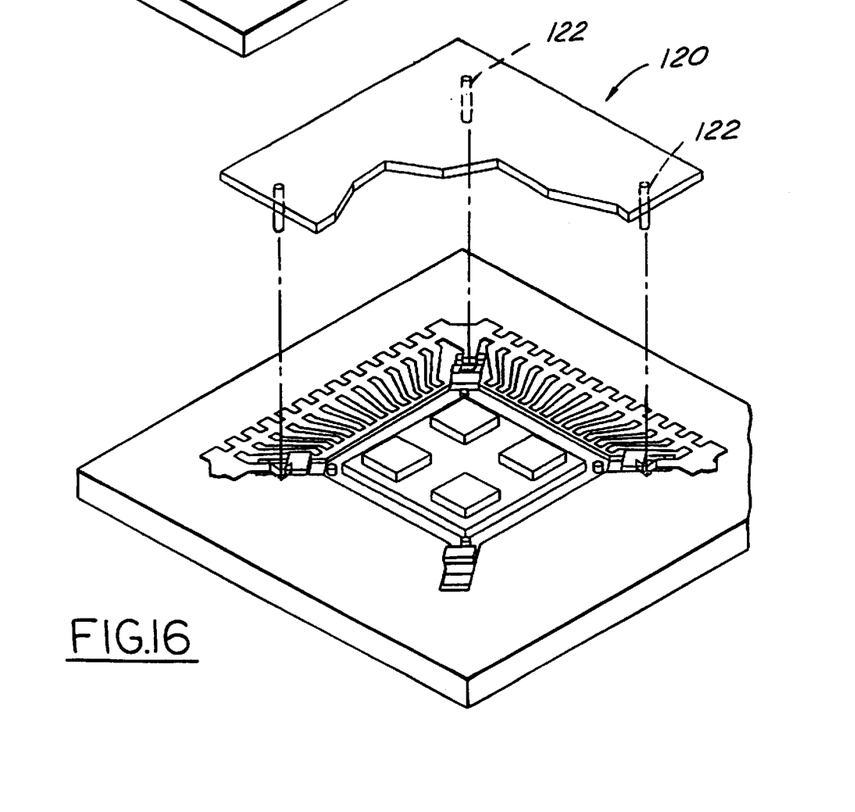
FIG. 16 is a perspective view showing an upper cavity of a bonding kit equipped with push pins positioned over a lead frame and a heat sink.
Figure 17:
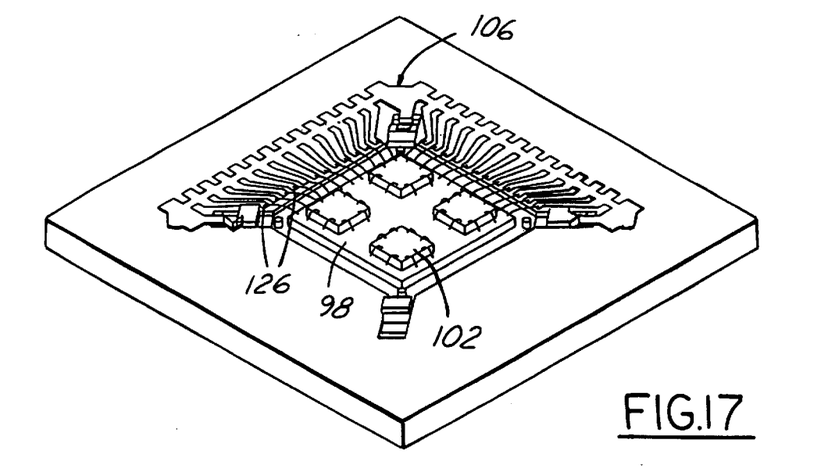
FIG. 17 is a perspective view showing bonding wires connected between the lead fingers on the lead frame and the substrate, and between the IC dies and the substrate.

In the next step of the process, as shown in FIG. 13, a substrate 98 is first mounted by a conductive adhesive (not shown) to the heat sink 90. A multiple number of IC dies 102 are then mounted to the substrate 98 by conductive adhesive (not shown) or by other techniques such as flip chips or TAB. FIG. 14 shows the IC dies 102 positioned over the substrate 98. Substrate 98 and the die 102 positioned thereon can be tested in a KGS (know good substrate) test prior to the assembly of heat sink 90 to lead frame 106. This allows the selection of only those dies and substrates that are functioning properly to be assembled to lead frame 106. In the next step of the process, lead frame 106 equipped with tie bars 108 is assembled to the heat sink 90 by latching the V-shaped metal hook 110 to the receptacle means 112 provided on the heat sink 90. This is shown in FIG. 15. The engagement of the V-shaped metal hook 110 to the receptacle means 112 on the heat sink 90 is carried out by the compression of the upper cavity 120 equipped with push rods 122, as shown in FIG. 16. In the last step of the process, the fingertips 126 on lead frame 106 are electrically connected in a wire bonding process to the substrate 98. This is shown in FIG. 17. The multiplicity of IC dies 102 are then connected to the substrate 98 by a subsequent wire bonding process. The wire bonding process between the IC dies 102 and the substrate 98 can also be performed before the wire bonding operation between the fingertips 126 and the substrate 98.

Figure 18:
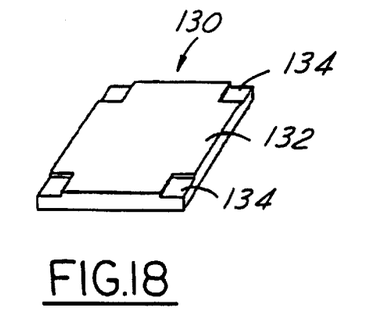
FIG. 18 is a perspective view of a heat sink equipped with receptacle means of recessed corners for bonding to a lead frame.
Figure 19:
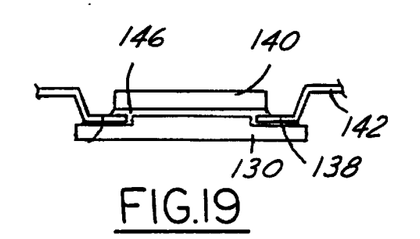
FIG. 19 is an enlarged cross-sectional view of an IC die bonded to a lead frame and a heat sink.
Figure 20:
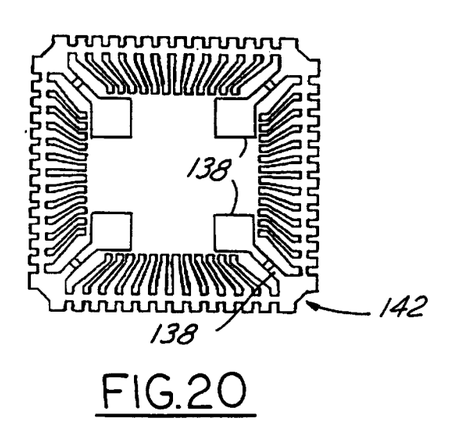
FIG. 20 is a plane view of a lead frame equipped with bonding pads formed on each tie bar.

A further embodiment of the present invention method of mounting a heat sink to a lead frame by using an adhesive method is shown in FIGS. 18–20. In this embodiment, a heat sink 130 is provided which has in its top surface 132 a multiplicity of recessed areas 134. This is shown in FIG. 18. A lead frame 142 equipped with bonding paddles 138 formed at the tip of the tie bars 136 is provided for bonding to the heat sink 130. This is shown in FIGS. 19 and 20. Prior to the assembly of the heat sink 30 to lead frame 142, a KGD test is first performed on the IC die 140. The heat sink 30 is assembled to lead frame 140 only after the die 140 has passed the KGD test. Heat sink 30 also serves the function of protecting die 140 during the test procedure.

While the present invention has been described in an illustrative manner, it should be understood that the terminology used is intended to be in a nature of words of description rather than of limitation.

Furthermore, while the present invention has been described in terms of a preferred embodiment and three alternate embodiments thereof, it is to be appreciated that those skilled in the art will readily apply these teachings to other possible variations of the invention.

The embodiments of the invention in which an exclusive property or privilege is claimed are defined as follows:

1. A method of detachably mounting a die paddle to a lead frame comprising the steps of:

providing a lead frame having lead fingers and a multiplicity of tie bars extending inwardly from said lead frame each having a fixed end integral with said lead frame and a free end equipped with an attachment means, providing a die paddle having a multiplicity of receptacle means adapted to receive said attachment means on said free ends of the tie bars, and detachably engaging said attachment means on said tie bars to said receptacle means on said die paddle.

2. A method according to claim 1, wherein said detachably engaging step comprising pressing said lead frame against said die paddle such that said attachment means on said tie bars engages said receptacle means on said die paddle.

3. A method of attaching an integrated circuit chip to a heat sink situated in a lead frame comprising the steps of:

providing a lead frame having lead fingers and a multiplicity of the tie bars emanating from said lead frame extending inwardly each having a fixed end integral with said lead frame and a free end equipped with an attachment means, providing a heat sink having a multiplicity of receptacle means adapted to receive said attachment means on said free ends of the tie bars at least one opening through the thickness of the die paddle, detachably engaging said attachment means on said tie bars to said receptacle means on the heat sink, and mounting at least one integrated circuit die to said heat sink.

4. A method according to claim 3, wherein said at least one integrated circuit die is mounted to said heat sink by an adhesive.

5. A lead frame/heat sink assembly comprising:

a lead frame having lead fingers and a multiplicity of tie bars extending inwardly from said lead frame each having a fixed end integral with said lead frame and a free end equipped with an attachment means, a heat sink having a multiplicity of receptacle means adapted to receive said attachment means on said free ends of the tie bars, and having at least one opening through the thickness of the die paddle, said attachment means on said tie bars are detachably engaged to said receptacle means on said heat sink.

6. A method of detachably mounting a die paddle to a lead frame comprising the steps of:

providing a lead frame having lead fingers and a multiplicity of tie bars extending inwardly from said lead frame each having a fixed end integral with said lead frame and a free end equipped with an attachment means, said attachment means comprising a formed metal member for engaging receptacle means on a die paddle, providing a die paddle having a multiplicity of receptacle means adapted to receive said attachment means on said free ends of the tie bars, and detachable engaging said attachment means on said tie bars to said receptacle means on said die paddle.

7. A method according to claim 6, wherein said die paddle having at least one opening through a thickness of the die paddle.

8. A method according to claim 6, wherein said attachment means comprising a formed V-shaped metal hook for mechanically latching to said receptacle means on said heat sink.

9. A method according to claim 6, wherein said heat sink having a surface exposed to the environment after been encapsulated in a plastic molded package.

10. A method according to claim 6 further comprising the step of removing said heat sink from said lead frame by disengaging said attachment means on said tie bars from said receptacle means on said heat sink.

11. A method according to claim 6, wherein said lead frame comprising three layers; a signal layer, a power layer, and a ground layer.

12. A method of attaching an integrated circuit chip to a heat sink situated in a lead frame comprising the steps of:

providing a lead frame having lead fingers and a multiplicity of tie bars emanating from said lead frame extending inwardly each having a fixed end integral with said lead frame and a free end equipped with an attachment means, providing a heat sink having a multiplicity of receptacle means adapted to receive said attachment means on said free ends of the tie bars, said heat sink having at least one opening through the thickness of the heat sink, detachably engaging said attachment means on said tie bars to said receptacle means on the heat sink, and mounting at least one integrated circuit die to said heat sink by an adhesive and then testing for KGD or KGS.

13. A method according to claim 12, wherein said at least one integrated circuit die is mounted to a substrate which in turn is mounted to said heat sink by an adhesive, flip chip or TAB process.

14. A method according to claim 12, wherein said at least one integrated circuit die is mounted to a substrate which is in turn mounted to said heat sink by an adhesive, flip chip or TAB process and tested for KGD or KGS.

15. A method according to claim 12, wherein said attachment means on said tie bars is engaged to said receptacle means on said heat sink by adhesion.

16. A method according to claim 12, wherein said attachment means comprising a formed metal member for engaging said receptacle means on said heat sink.

17. A method according to claim 12, wherein said at least one integrated circuit die is mounted to said heat sink prior to the engagement of said heat sink with said lead frame.

18. A method according to claim 12, wherein said lead frame comprises three layers of a signal layer, a power layer and a ground layer.

19. A lead frame/heat sink comprising a lead frame having lead fingers and a multiplicity of tie bars extending inwardly from said lead frame each having a fixed end integral with said lead frame and a free end equipped with an attachment means, a heat sink having a multiplicity of receptacle means adapted to receive said attachment means on said free ends of the tie bars, and having at least one opening through the thickness of the heat sink, and an integrated circuit die mounted to a top surface of the heat sink, said attachment means on said tie bars are detachable engaged to said receptacle means on said heat sink.

20. An assembly according to claim 19 further comprising a multiplicity of integrated circuit dies mounted to a top surface of the heat sink.

21. An assembly according to claim 19, wherein said attachment means on said tie bars comprising a formed metal member for engaging said receptacle means on said heat sink.

22. An assembly according to claim 19 further comprising at least one integrated circuit die mounted to a top surface of the heat sink by a thermally conductive adhesive.

23. An assembly according to claim 19, wherein said lead frame comprises three layers of a signal layer, a power layer and a ground layer.

* * * * *